US009244119B2

(12) United States Patent
Choi et al.

(10) Patent No.: US 9,244,119 B2
(45) Date of Patent: Jan. 26, 2016

(54) APPARATUS FOR TESTING A SEMICONDUCTOR PACKAGE

(71) Applicant: Samsung Electronics Co., Ltd., Suwon-si, Gyeonggi-Do (KR)

(72) Inventors: Gui-Heum Choi, Asan-si (KR); In-Sik Kim, Asan-si (KR); Bo-Keun Shim, Asan-si (KR); Sung-Jae Lim, Asan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 156 days.

(21) Appl. No.: 14/059,916

(22) Filed: Oct. 22, 2013

(65) Prior Publication Data
US 2014/0253168 A1    Sep. 11, 2014

(30) Foreign Application Priority Data

Mar. 8, 2013  (KR) .................. 10-2013-0024786

(51) Int. Cl.
*G01R 31/00* (2006.01)
*G01R 31/28* (2006.01)

(52) U.S. Cl.
CPC .................. *G01R 31/2893* (2013.01)

(58) Field of Classification Search
CPC .. G01R 31/28; G01R 31/2893; G01R 1/0425; G01R 31/01; G01R 31/02; G01R 31/2801; G01R 31/2863; G01R 31/2867; G01R 31/0483; G01R 1/0408; G01R 1/045; G01R 1/0433
See application file for complete search history.

(56) References Cited

U.S. PATENT DOCUMENTS

| | | | |
|---|---|---|---|
| 6,425,178 B1 * | 7/2002 | Lee et al. | ............ 29/759 |
| 6,498,472 B1 * | 12/2002 | Lee et al. | ......... 324/750.03 |
| 6,518,745 B2 | 2/2003 | Kim et al. | |
| 7,257,747 B2 | 8/2007 | Song | |
| 7,429,868 B2 | 9/2008 | Park et al. | |
| 2012/0142203 A1 | 6/2012 | Choi | |

FOREIGN PATENT DOCUMENTS

| | | |
|---|---|---|
| JP | 2002257900 A | 9/2002 |
| KR | 0610778 | 6/2006 |
| KR | 0702587 | 10/2006 |
| KR | 20070062082 A | 6/2007 |
| KR | 0795490 | 1/2008 |
| KR | 1076475 | 11/2010 |

* cited by examiner

*Primary Examiner* — Son Le
(74) *Attorney, Agent, or Firm* — Harness, Dickey & Pierce, P.L.C.

(57) ABSTRACT

An apparatus for testing a semiconductor package including a shuttle, a socket and a pressing unit may be provided. The shuttle may include a pocket, which is configured to receive the semiconductor package and a printed circuit board (PCB). The PCB may be configured to make electrical contact with the semiconductor package. The socket may be arranged under the shuttle and include socket pins configured to make electrical contact with the PCB. The pressing unit may be arranged on the shuttle and may be movable in a vertical direction. The pressing unit may press on the shuttle toward the socket such that the semiconductor package may be electrically connected to the socket pins. Because the semiconductor package received in the shuttle may make contact with the socket at the testing region to test the semiconductor package, the semiconductor package may not fall off or may not be slanted.

15 Claims, 5 Drawing Sheets

APPARATUS FOR TESTING A SEMICONDUCTOR PACKAGE

CROSS-RELATED APPLICATION

This application claims priority under 35 USC §119 to Korean Patent Application No. 2013-24786, filed on Mar. 8, 2013 in the Korean Intellectual Property Office (KIPO), the contents of which are herein incorporated by reference in their entirety.

BACKGROUND

1. Field

Example embodiments relate to apparatuses for testing a semiconductor package.

2. Description of the Related Art

Generally, after manufacturing a semiconductor package, an electrical test of the semiconductor package may be performed. The electrical test may include making the semiconductor package contact a socket, and supplying a test current to the semiconductor package through the socket.

According to related arts, a robot may load the semiconductor package into a shuttle in a loading region. The shuttle may be transferred to a testing region where the socket may be positioned. A pressing unit may press the semiconductor package toward the socket in the testing region so that contact the semiconductor package electrically contacts the socket. The test current may be supplied to the semiconductor package through the socket. The shuttle may be transferred back to an unloading region. The robot may unload the tested semiconductor package from the shuttle. In order to transfer the semiconductor package between the loading region and the testing region, and the testing region and the unloading region, the robot may transfer the semiconductor package using vacuum.

However, when a vacuum line malfunctions, the semiconductor package may fall off. Further, when the pressing unit is slanted, the semiconductor package may not make accurate contact with the socket. Furthermore, the pressing unit may be replaced with another pressing unit in accordance with types of the semiconductor package.

SUMMARY

Example embodiments provide apparatuses for testing a semiconductor package that may be capable of improving test reliability and shortening a test time.

According to example embodiments, an apparatus for testing a semiconductor package may include a shuttle, a socket and a pressing unit. The shuttle may include a pocket configured to receive the semiconductor package and a printed circuit board (PCB). The PCB may be configured to make electrical contact with the semiconductor package. The socket may be positioned under the shuttle. The socket may include socket pins configured to make electrical contact with the PCB. The pressing unit may be arranged on the shuttle and be movably in a vertical direction. The pressing unit may be configured to press on the shuttle toward the socket such that the semiconductor package is electrically connected to the socket pins.

In example embodiments, the shuttle may further include a sliding door mechanism configured to selectively open/close an entrance of the pocket through which the semiconductor package may enter and exit.

In example embodiments, the sliding door mechanism may include a sliding door slidably arranged at the entrance of the pocket, a spring coupled to and between the sliding door and the pocket and configured to resiliently support the sliding door in an opening direction of the entrance, and a latch installed at the pocket to hold or fix the sliding door.

In example embodiments, the shuttle may further include a spring connected to and between the pocket and the PCB.

In example embodiments, the apparatus may further include a robot configured to load/unload the semiconductor package into and out of the pocket.

According to example embodiments, an apparatus for testing a semiconductor package may include a shuttle, a robot, a socket and a pressing unit. The shuttle may be configured to transfer the semiconductor package at least one of between a loading region and a testing region and between the testing region and an unloading region. The robot may be positioned in the loading region to load the semiconductor package into the shuttle. The robot may be positioned in the unloading region to unload the semiconductor package out of the shuttle. The socket may be positioned in the testing region and configured to test the semiconductor package in the shuttle. The pressing unit may be positioned in the testing region and configured to press on the shuttle toward the socket such that the semiconductor package contacts the socket.

In example embodiments, the shuttle may include a pocket having an entrance through which the semiconductor package may enter and exit, a printed circuit board (PCB) arranged in the pocket and configured to make electrical contact with the semiconductor package, and a sliding door mechanism configured to selectively open/close the entrance of the pocket.

In example embodiments, the sliding door mechanism may include a sliding door slidably arranged at the entrance of the pocket, a spring coupled to and between the sliding door and the pocket and configured to resiliently support the sliding door in an opening direction of the entrance, and a latch installed at the pocket to hold or fix the sliding door.

In example embodiments, the shuttle may further include a spring coupled to and between the pocket and the PCB.

According to example embodiments, an apparatus for testing a semiconductor package may include a shuttle including a pocket, a printed circuit board (PCB) on a bottom surface of the pocket, and a first resilient member coupled to and between the pocket and the PCB, the pocket configured to receive the semiconductor package, the PCB configured to make electrical contact with the semiconductor package, a socket including socket pins and arranged under the shuttle, and a pressing unit on the shuttle, the pressing unit being movable in a vertical direction and configured to press on the shuttle such that the semiconductor package is electrically connected to the socket pins.

The pressing unit may be configured to further press the pocket after the PCB contacts the socket such that an electrical contact between the PCB and the socket pins is ensured using the first resilient member.

The socket pins may be configured to contact the PCB.

The semiconductor package may be electrically connected to the socket pins via the PCB.

The shuttle further may include a sliding door mechanism, which is configured to selectively open/close an entrance of the pocket, through which the semiconductor package enters and exits.

The sliding door mechanism may include a sliding door slidably coupled to the entrance of the pocket, a second resilient member coupled to and between the sliding door and the pocket, the second resilient member configured to resiliently support the sliding door toward an opening direction of the sliding door, and a latch at the pocket to hold the sliding door.

At least one of the first and second resilient members may be a spring.

According to example embodiments, because the semiconductor package is received and transferred, and makes contact with the socket at the testing region to test the semiconductor package, the semiconductor package may not fall off or may not be slanted. Further, the semiconductor package previously aligned with the shuttle may make contact with the socket, an accurate contact between the semiconductor package and the socket may be ensured. Furthermore, the pressing unit may operate regardless of types of the semiconductor package, so that the pressing unit may be continuously used for various semiconductor packages without replacement.

BRIEF DESCRIPTION OF THE DRAWINGS

Example embodiments will be more clearly understood from the following detailed description taken in conjunction with the accompanying drawings.

FIG. 1 is a block diagram illustrating an apparatus for testing a semiconductor package in accordance with example embodiments;

FIG. 2 is a cross-sectional view illustrating a shuttle in a loading region of the apparatus in FIG. 1;

FIG. 3 is a cross-sectional view illustrating the shuttle in a testing region of the apparatus in FIG. 1;

FIG. 4 is a cross-sectional view illustrating the shuttle in an unloading region of the apparatus in FIG. 1; and FIGS. 5 to 10 are cross-sectional views illustrating operations for testing the semiconductor package.

DETAILED DESCRIPTION OF EXAMPLE EMBODIMENTS

Figure 1:
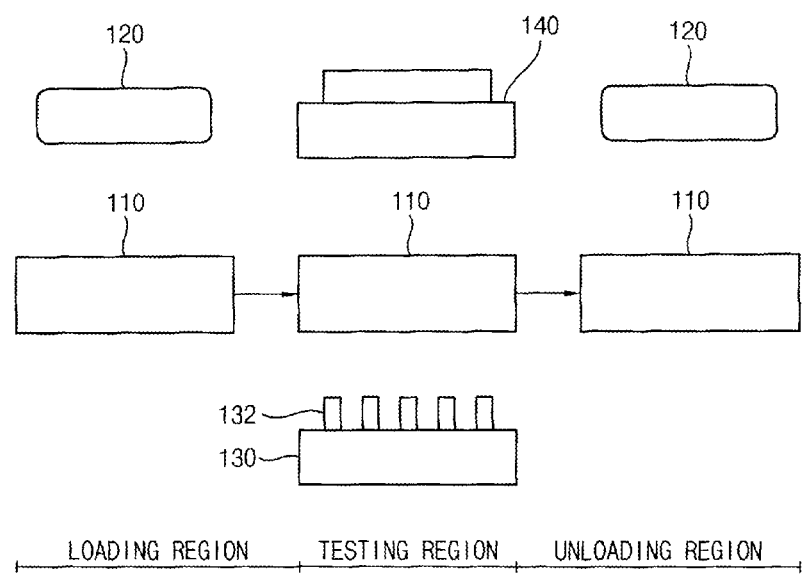
FIGS. 1 to 10 represent non-limiting, example embodiments as described herein.

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this disclosure will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which these example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
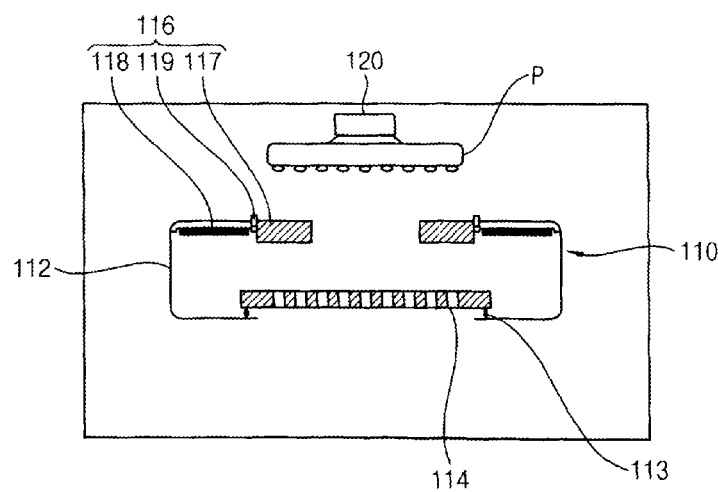
Figure 3:
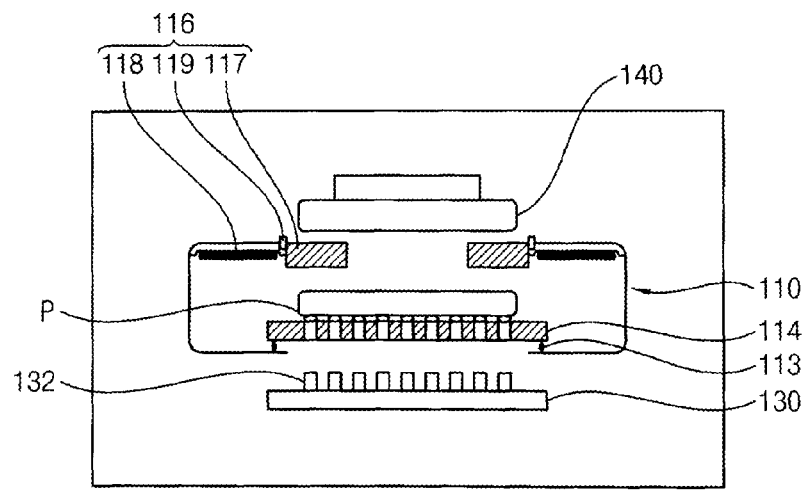
Figure 4:
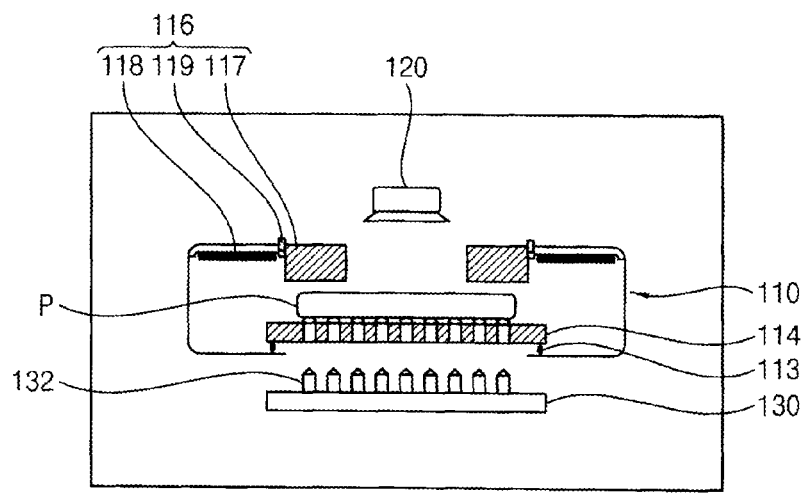

FIG. 1 is a block diagram illustrating an apparatus for testing a semiconductor package in accordance with example embodiments, FIG. 2 is a cross-sectional view illustrating a shuttle in a loading region of the apparatus in FIG. 1, FIG. 3 is a cross-sectional view illustrating the shuttle in a testing region of the apparatus in FIG. 1, and FIG. 4 is a cross-sectional view illustrating the shuttle in an unloading region of the apparatus in FIG. 1.

Referring to FIGS. 1 to 4, an apparatus 100 for testing a semiconductor package in accordance with this example embodiment may include a shuttle 110, a robot 120, a socket 130 and a pressing unit 140.

The shuttle 10 (e.g., a shuttle) may be transferred between a loading region where the semiconductor package P may be loaded and a testing region where the semiconductor package P may be tested, and between the testing region and an unloading region where the tested semiconductor package P may be unloaded.

The robot 120 may be positioned in the loading region to load the semiconductor package P into the shuttle 110. The robot 120 may be positioned in the unloading region to unload the tested semiconductor package P from the shuttle 110.

The socket 130 may be positioned in the testing region to make electrical contact with the semiconductor package P. The pressing unit 140 may be positioned in the testing region to make the semiconductor package P contact the socket 130.

In example embodiments, the shuttle 110 may include a pocket 112, a PCB 114 and a sliding door mechanism 116. The pocket 112 may have an inner space configured to receive the semiconductor package P. The pocket 112 may have an entrance through which the semiconductor package P may enter and exit. The entrance may be located at an upper surface of the pocket 112. The PCB 114 may be arranged at a bottom surface of the pocket 112. The PCB may have a circuit configured to make electrical contact with the semiconductor package P. The PCB may be connected or coupled to the bottom surface of the pocket 112 via a spring 113.

The sliding door mechanism 116 may selectively open/close the entrance of the pocket 112. In example embodiments, the sliding door mechanism 116 may include a sliding door 117, a spring 118 and a latch 119. The sliding door 116 may be slidably connected to the entrance of the pocket 112. The spring 118 may be connected between the sliding door 117 and an inner surface of the pocket 112 to resiliently support the sliding door 117 toward an opening direction of the sliding door 117. Thus, the spring 118 may continuously apply a spring force to the sliding door 117 in a pulling direction from the sliding door 117 to the inner surface of the pocket 112. The latch 119 may be rotatably connected or coupled to the pocket 112 to hold or fix the sliding door 117. Thus, the latch 119 may hold or fix the sliding door 117 to prevent the sliding door 117 from being opened by the spring 118.

The robot 120 may be positioned in the loading region and/or in the unloading region. In example embodiments, the robot 120 may be positioned over the shuttle 110 transferred to the loading region and/or the unloading region.

In the loading region, the robot 120 may descend to the shuttle 110 to load the semiconductor package P into the shuttle 110. In example embodiments, when the robot 120 descends to the shuttle 110, the robot 120 may press the latch 119. The latch 119 may be rotated to release the sliding door 117. Thus, the sliding door 117 may move toward the inner surface of the pocket 112 by the spring 118 so that the entrance of the pocket 112 may be opened. The robot 120 may load the semiconductor package P into the pocket 112 through the opened entrance. The semiconductor package P may be placed on the PCB 114 to make electrical contact with the PCB 114. When the robot 120 ascends, the latch 119 may be returned to an original position. Thus, the latch 119 may hold or fix the sliding door 117 so that the sliding door 117 may close the entrance of the pocket 112.

In contrast, in the unloading region, the robot 120 may unload the tested semiconductor package P from the shuttle 110. Unloading operations of the semiconductor package P by the robot 120 may be in reverse order of the loading operations of the semiconductor package P.

The socket 130 may be positioned in the testing region. The socket 130 may be arranged under the shuttle 110 transferred to the testing region. The socket 130 may have a plurality of socket pins 132. The socket pins 132 may make electrical contact with the PCB 114. Thus, the socket pins 132 may be electrically connected to the semiconductor package P through the PCB 114. A test current may be supplied to the semiconductor package P through the socket pins 132 to test the semiconductor package P.

The pressing unit 140 may be positioned in the testing region. The pressing unit 140 may be arranged movably in a vertical direction over the shuttle 110, which is transferred to the testing region. The pressing unit 140 may downwardly press the pocket 112 to make the PCB 114 contact the socket 130.

FIGS. 5 to 10 are cross-sectional views illustrating operations for testing the semiconductor package.

Figure 5:
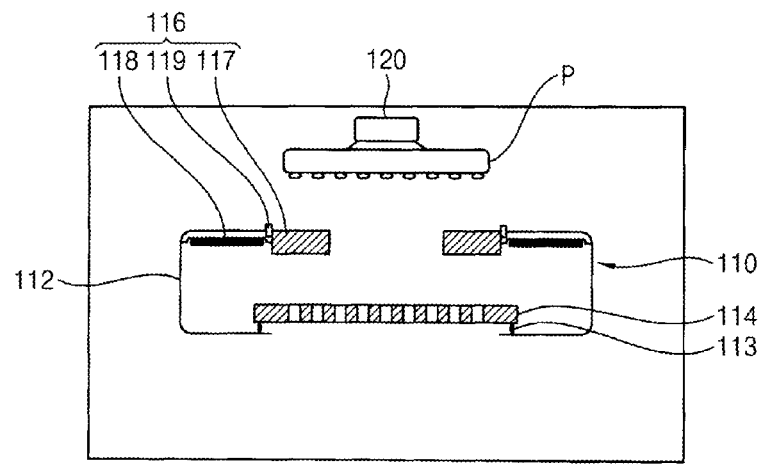

Referring to FIG. 5, the shuttle 110 may be transferred to the loading region. The robot 120 holding the semiconductor package P may be arranged over the shuttle 110.

Figure 6:
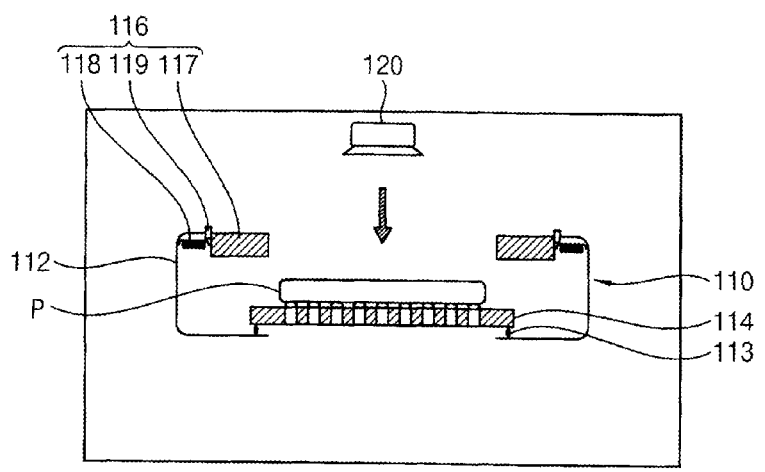

Referring to FIG. 6, the robot 120 may descend toward the shuttle 110. The robot 120 may press the latch 119 so that the latch 119 may be rotated. Thus, the sliding door 117 may be moved toward the inner surface of the pocket 112 by the spring 118 so that the entrance of the pocket 112 may be opened. The semiconductor package P may be loaded into the pocket 112 through the opened entrance of the pocket 112. The loaded semiconductor package P may be placed on the PCB 114. The semiconductor package P may make electrical contact with the PCB 114.

Figure 7:
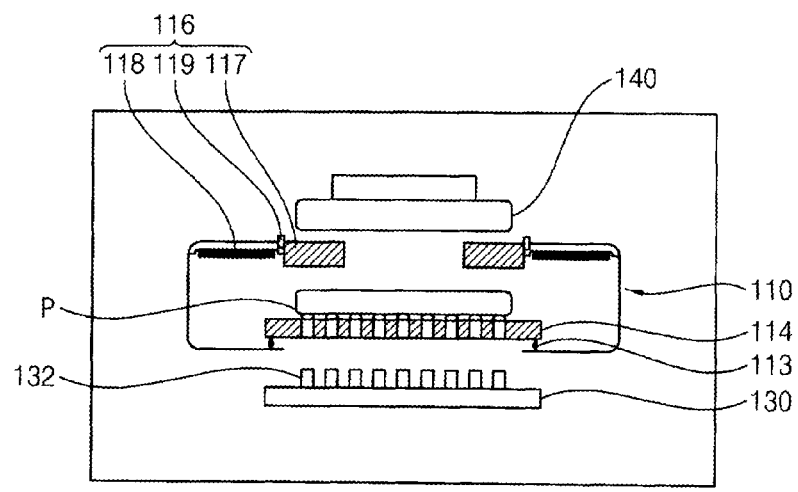

Referring to FIG. 7, the shuttle 110 may be transferred to the testing region. The shuttle 110 may be positioned between the contacting unit 140 and the socket 130.

Figure 8:
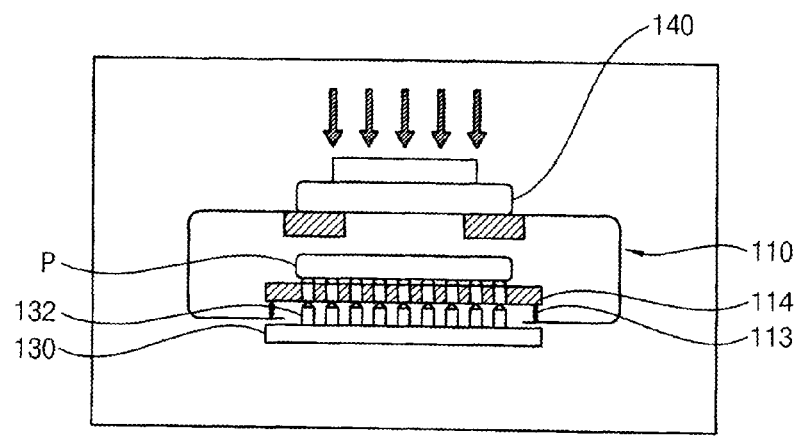

Referring to FIG. 8, the pressing unit 140 may descend to press the upper surface of the pocket 112. Thus, the pocket 112 and the PCB 115 may be descended toward the socket 130. When the PCB 114 contacts (e.g., reaches) the upper surface of the socket 130, the PCB 114 may cease to descend. In contrast, the pocket 112 connected to the PCB 114 via the spring 113 may descend slightly further by using an extension of the spring 113. Therefore, the electrical contact between the PCB 114 and the socket pins 132 may be improved or ensured by further descending the pocket 112 than the PCB 114.

The test current may be supplied to the semiconductor package P through the socket pins 132 and the PCB 114 to test electrical characteristics of the semiconductor package P.

After completing the test, the pressing unit 140 may ascend. Thus, the shuttle 110 may be returned to the original position.

Figure 9:
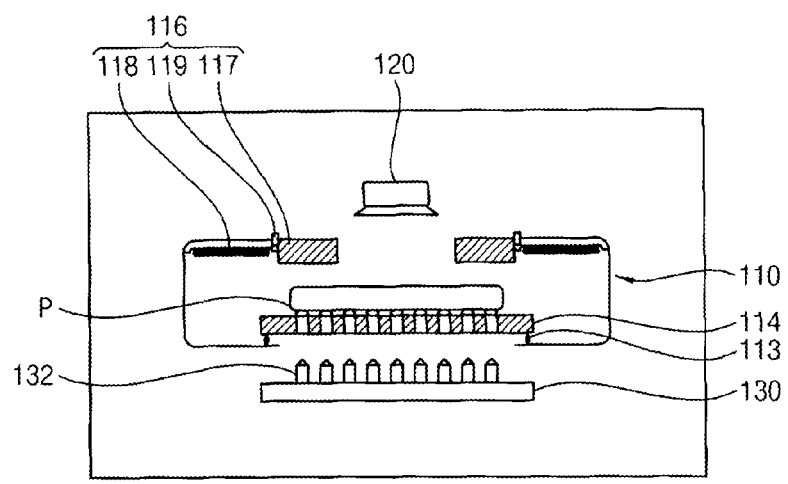

Referring to FIG. 9, the shuttle 110 may be transferred to the unloading region. The tested semiconductor package P may be received in the shuttle 110.

Figure 10:
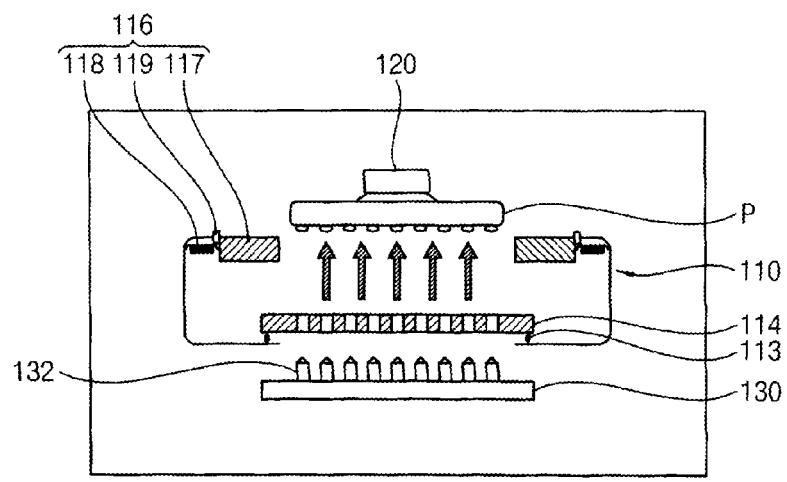

Referring to FIG. 10, the robot 120 may descend toward the shuttle 110. The robot 120 may press the latch 119 so that the latch 119 may be rotated. The sliding door 117 may move toward the inner surface of the pocket 112 by the spring 118 so that the entrance of the pocket 112 may be opened. The robot 120 may hold the semiconductor package P. The robot 120 may then ascend together with the semiconductor package P.

According to example embodiments, because the semiconductor package is received and transferred in the shuttle and makes contact with the socket at the testing region to test the semiconductor package, the semiconductor package may not fall off or may not be slanted. Further, because the semiconductor package previously aligned with the shuttle may make contact with the socket, an accurate contact between the semiconductor package and the socket may be ensured. Still Furthermore, the pressing unit may operate regardless of types of the semiconductor package, so that the pressing unit may be continuously used for various semiconductor packages without replacement.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An apparatus for testing a semiconductor package, the apparatus comprising:
    a shuttle including a pocket, the pocket configured to receive the semiconductor package and a printed circuit board (PCB), the PCB configured to make electrical contact with the semiconductor package;
    a socket under the shuttle, the socket including socket pins configured to make electrical contact with the PCB; and
    a pressing unit arranged on the shuttle, the pressing unit being movable in a vertical direction and configured to press on the shuttle such that the semiconductor package is electrically connected to the socket pins,
    wherein the shuttle further includes a sliding door mechanism configured to selectively open/close an entrance of the pocket, through which the semiconductor package enters and exits.

2. The apparatus of claim 1, wherein the sliding door mechanism comprises:
    a sliding door slidably arranged at the entrance of the pocket;
    a spring coupled to and between the sliding door and the pocket, the spring configured to resiliently support the sliding door toward an opening direction of the sliding door; and
    a latch at the pocket to hold the sliding door.

3. The apparatus of claim 1, wherein the shuttle further includes a spring coupled to and between the pocket and the PCB.

4. The apparatus of claim 1, further comprising a robot configured to load/unload the semiconductor package into/out of the pocket.

5. An apparatus for testing a semiconductor package, the apparatus comprising:
    a shuttle configured to transfer the semiconductor package at least one of between a loading region and a testing region and between the testing region and an unloading region;
    a robot configured to at least one of load the semiconductor package into the shuttle in the loading region and unload the semiconductor package out of the shuttle in the unloading region;
    a socket in the testing region and configured to test the semiconductor package in the shuttle; and
    a pressing unit in the testing region, the pressing unit configured to press on the shuttle such that the semiconductor package contacts the socket,
    wherein the shuttle includes,
        a pocket having an entrance through which the semiconductor package enters and exits,
        a PCB arranged in the pocket, the PCB configured to make electrical contact with the semiconductor package, and
        a sliding door mechanism configured to selectively open/close the entrance of the pocket.

6. The apparatus of claim 5, wherein the sliding door mechanism comprises:
    a sliding door slidably arranged at the entrance of the pocket;
    a spring coupled to and between the sliding door and the pocket, the spring configured to resiliently support the sliding door toward an opening direction of the sliding door; and
    a latch at the pocket to hold the sliding door.

7. The apparatus of claim 5, wherein the shuttle further comprises a spring coupled to and between the pocket and the PCB.

8. An apparatus for testing a semiconductor package, the apparatus comprising:
    a shuttle including a pocket, a printed circuit board (PCB) on a bottom surface of the pocket, and a first resilient member coupled to and between the pocket and the PCB, the pocket configured to receive the semiconductor package, the PCB configured to make electrical contact with the semiconductor package;
    a socket including socket pins, the socket arranged under the shuttle; and
    a pressing unit on the shuttle, the pressing unit being movable in a vertical direction and configured to press on the shuttle such that the semiconductor package is electrically connected to the socket pins.

9. The apparatus of claim 8, wherein the first resilient member is a spring.

10. The apparatus of claim 8, wherein the pressing unit is configured to further press the pocket after the PCB contacts the socket such that an electrical contact between the PCB and the socket pins is ensured using the first resilient member.

11. The apparatus of claim 8, wherein the socket pins are configured to contact the PCB.

12. The apparatus of claim 8, wherein the semiconductor package is electrically connected to the socket pins via the PCB.

13. The apparatus of claim 8, wherein the shuttle further includes a sliding door mechanism configured to selectively open/close an entrance of the pocket, through which the semiconductor package enters and exits.

14. The apparatus of claim 13, wherein the sliding door mechanism comprises:
    a sliding door slidably coupled to the entrance of the pocket;

a second resilient member coupled to and between the sliding door and the pocket, the second resilient member configured to resiliently support the sliding door toward an opening direction of the sliding door; and a latch at the pocket to hold the sliding door.

15. The apparatus of claim 14, wherein the second resilient member is a spring.

* * * * *